(12) United States Patent
Zhu et al.

(10) Patent No.: US 11,961,749 B2
(45) Date of Patent: Apr. 16, 2024

(54) WAFER DETECTION DEVICE AND WAFER DETECTION METHOD USING THE SAME

(71) Applicant: HANGZHOU SIZONE ELECTRONIC TECHNOLOGY INC., Zhejiang (CN)

(72) Inventors: Ming Zhu, Zhejiang (CN); Yangyang Chen, Zhejiang (CN); Linghan Shen, Zhejiang (CN)

(73) Assignee: HANGZHOU SIZONE ELECTRONIC TECHNOLOGY INC., Zhejiang (CN)

( * ) Notice: Subject to any disclaimer, the term of this patent is extended or adjusted under 35 U.S.C. 154(b) by 216 days.

(21) Appl. No.: 17/623,881

(22) PCT Filed: Aug. 4, 2020

(86) PCT No.: PCT/CN2020/106749
§ 371 (c)(1),
(2) Date: Dec. 30, 2021

(87) PCT Pub. No.: WO2021/023176
PCT Pub. Date: Feb. 11, 2021

(65) Prior Publication Data
US 2022/0359245 A1 Nov. 10, 2022

(30) Foreign Application Priority Data

Aug. 6, 2019 (CN) .......................... 201910722298.X

(51) Int. Cl.
*G03F 7/20* (2006.01)
*G01B 11/27* (2006.01)
(Continued)

(52) U.S. Cl.
CPC ...... *H01L 21/67259* (2013.01); *G01B 11/272* (2013.01); *H01L 21/68721* (2013.01)

(58) Field of Classification Search
CPC ......... H01L 21/67259; H01L 21/68721; H01L 21/67034; H01L 21/68728; H01L 22/12; H01L 22/20; G01B 11/272; G01V 8/22
See application file for complete search history.

(56) References Cited

U.S. PATENT DOCUMENTS 5,796,486 A 8/1998 Jacob

FOREIGN PATENT DOCUMENTS

| CN | 102376608 | 3/2012 |
| CN | 202649489 | 1/2013 |

(Continued)

OTHER PUBLICATIONS

"International Search Report (Form PCT/ISA/210) of PCT/CN2020/106749" dated Oct. 28, 2020, with English translation thereof, pp. 1-6.

*Primary Examiner* — Mesfin T Asfaw
(74) *Attorney, Agent, or Firm* — JCIP GLOBAL INC.

(57) ABSTRACT

A device for detecting whether a wafer is present on a clamping jaw and detecting whether the wafer is parallel to a bottom of the clamping jaw. The device for detecting a wafer comprises: a wafer parallel measuring unit arranged in a CMP cleaning and drying device, and used for emitting a parallel measuring laser beam parallel to the bottom of the clamping jaw and receiving the parallel measuring laser beam; a wafer detection unit used for emitting a wafer detecting laser beam to the wafer and receiving the wafer detecting laser beam; and a detection processing unit electrically connected to the wafer parallel measuring unit and the wafer detection unit, and used for determining whether the wafer is present on the clamping jaw and whether the wafer is parallel to the bottom of the clamping jaw according to the received wafer detecting laser beam and parallel measuring laser beam.

16 Claims, 7 Drawing Sheets

(51) Int. Cl.
*H01L 21/67* (2006.01)
*H01L 21/687* (2006.01)

(56) References Cited

FOREIGN PATENT DOCUMENTS

| | | | |
|---|---|---|---|
| CN | 102956518 | 3/2013 | |
| CN | 203858376 | 10/2014 | |
| CN | 104916560 | 9/2015 | |
| CN | 107610997 | 1/2018 | |
| CN | 110411378 | 11/2019 | |
| JP | H04218942 | 8/1992 | |
| WO | WO-2019015451 A1 * | 1/2019 | .............. H01J 37/32 |

* cited by examiner

WAFER DETECTION DEVICE AND WAFER DETECTION METHOD USING THE SAME

CROSS-REFERENCE TO RELATED APPLICATION

This application is a 371 of international application of PCT application serial no. PCT/CN2020/106749, filed on Aug. 4, 2020, which claims the priority benefit of China application no. 201910722298.X, filed on Aug. 6, 2019. The entirety of each of the above mentioned patent applications is hereby incorporated by reference herein and made a part of this specification.

TECHNICAL FIELD

The invention involves the technical field of semiconductors, and particularly involves a device used for detecting whether a wafer is clamped by a clamping jaw inside a CMP cleaning and drying device and whether a wafer is parallel to bottom of a clamping jaw.

DESCRIPTION OF RELATED ART

Semiconductor components are the electronic circuits formed through lithography, etching, various chemical depositions and planarization. In order to form desired patterns on wafers, patterns are firstly defined by lithography; the parts not desired are removed by etching; after the etching is finished, a chemical mechanical planarization (CMP) is performed.

Generally, a CMP device includes an equipment front end module (EFEM), a cleaning unit and a polishing unit. With cleaning and drying devices of an existing CMP cleaning and drying equipment, such as the devices using spin rinse dry (SRD) and the devices cleaning and drying wafers with IPA, wafers are static by clamping jaws and placed in such cleaning and drying devices; wafers are clamped by clamping parts at tops of clamping jaws; wafers are parallel to and maintain certain distances from bottoms of clamping jaws. If wafers are placed not parallel to bottoms of clamping jaws as required, wafers may not be clamped by clamping jaws and escape from work positions during drying, both wafers and wafer cleaning devices may be damaged. Therefore, before cleaning and drying devices operate, it shall be detected whether wafers are successfully placed on required planes and are parallel to bottoms of clamping jaws.

Under existing technology, firstly one laser beam not parallel to a wafer is adopted to detect whether the wafer is clamped by a clamping jaw, and then one laser beam parallel to a wafer is used to detect whether the wafer is parallel to bottom of the clamping jaw. Main problem about the scheme is that wafers tilting at particular angles may not be detected by just one parallel measuring laser beam. In addition, wafers shall be placed horizontally under existing technology, and existing wafer detecting units and wafer parallel measuring units can only be used when cleaning and drying modules are designed as placing wafers horizontally. Under existing technology, laser sensors and other relevant components need to be installed below wafers; in actual applications, cleaning liquids may drip onto such laser sensors and result in failures of such laser sensors.

SUMMARY

The invention aims to provide a wafer detection device for detecting whether a wafer is clamped by a clamping jaw inside a CMP cleaning and drying device and detecting whether the wafer is parallel to bottom of the clamping jaw. The invention can improve both the accuracy and the efficiency of detecting whether a wafer exists or not and detecting whether the wafer is parallel to bottom of the clamping jaw, and greatly lower breakage rate for wafer cleaning and drying process.

In order to fulfill above aim, the invention provides a wafer detection device, a wafer is static and is placed inside a CMP cleaning and drying device by a clamping jaw, a periphery of the wafer is clamped by the clamping part at top of the clamping jaw, the wafer is parallel to a bottom of the clamping jaw and there is a certain distance between the wafer and the bottom of the clamping jaw, the wafer is placed on a work plane. The work plane is a plane onto which the wafer shall be placed inside the CMP cleaning and drying device. The wafer detection device detects whether a wafer is clamped by a clamping jaw inside a CMP cleaning and drying device and whether the wafer is parallel to bottom of the clamping jaw. The wafer detection device includes:

a wafer parallel measuring unit, which is set inside a CMP cleaning and drying device and is used for emitting a parallel measuring laser beam parallel to bottom of a clamping jaw and receiving the parallel measuring laser beam; when a wafer is parallel to bottom of the clamping jaw, the parallel measuring laser beam will not be blocked by the wafer; the optical signal of the received parallel measuring laser beam converted by the wafer parallel measuring unit corresponds to a first electrical signal;

a wafer detecting unit, which is set inside a CMP cleaning and drying device and is used for emitting a wafer detecting laser beam to wafer and receiving the wafer detecting laser beam; the optical signal of the received wafer detecting laser beam converted by the wafer detecting unit corresponds to a second electrical signal, or a distance value will be generated on basis of the optical signal of the received wafer detecting laser beam;

a detection processing unit, which is electrically connected to the wafer parallel measuring unit and the wafer detecting unit; the detection processing unit judges whether a wafer is parallel to bottom of a clamping jaw on basis of the first electrical signal; the detection processing unit judges whether a wafer is clamped by a clamping jaw on basis of the second electrical signal; or the detection processing unit judges whether a wafer is clamped by a clamping jaw by comparing the distance value with preset distance threshold value.

Preferably, the wafer parallel measuring unit includes: at least one transmittance laser generator and at least one transmittance laser receiver, and each transmittance laser receiver corresponds to one transmittance laser generator; the transmittance laser receiver is electrically connected to the detection processing unit; the transmittance laser generator emits a parallel measuring laser beam, the parallel measuring laser beams emitted by the different transmittance laser generators have different frequencies, and each parallel measuring laser beam intersects with other parallel measuring laser beams; the transmittance laser receiver receives the parallel measuring laser beam emitted by the corresponding transmittance laser generator, and converts the optical signal of such received parallel measuring laser beam into the corresponding first electrical signal; if it can be deduced from the first electrical signal that the transmittance laser receiver can receive the parallel measuring laser beam emitted by the corresponding transmittance laser generator, then it can be judged that a wafer is parallel to bottom of a clamping jaw.

Preferably, the wafer parallel measuring unit includes: at least one regression-reflection laser generator and at least one reflector, and each regression-reflection laser generator corresponds to one reflector; the regression-reflection laser generator is electrically connected to the detection processing unit; the regression-reflection laser generator emits a parallel measuring laser beam, the corresponding reflector reflects such emitted parallel measuring laser beam back to the regression-reflection laser generator along original path, the regression-reflection laser generator receives such reflected parallel measuring laser beam and converts the optical signal of such received parallel measuring laser beam into the corresponding first electrical signal; the parallel measuring laser beams emitted by the different regression-reflection laser generators have different frequencies, and each parallel measuring laser beam intersects with other parallel measuring laser beams; if it can be deduced from the first electrical signal that the regression-reflection laser generator can receive the parallel measuring laser beam it emitted, then it can be judged that a wafer is parallel to bottom of a clamping jaw.

Preferably, the wafer parallel measuring unit includes: at least one transmittance laser generator, at least one transmittance laser receiver and at least one reflector, and each transmittance laser generator corresponds to one transmittance laser receiver and one reflector; the transmittance laser generator emits a parallel measuring laser beam, the reflector reflects such emitted parallel measuring laser beam, the corresponding transmittance laser receiver receives such reflected parallel measuring laser beam and converts the optical signal of such received parallel measuring laser beam into the corresponding first electrical signal; the parallel measuring laser beams emitted by the different transmittance laser generators have different frequencies; both the parallel measuring laser beams emitted by the transmittance laser generator and reflected by the reflector are parallel to the bottom of the clamping jaw and a distance between the parallel measuring laser beams emitted by the transmittance laser generator and the bottom of the clamping jaw and a distance between the parallel measuring laser beams reflected by the reflector and the bottom of the clamping jaw are the same; if it can be deduced from the first electrical signal that the transmittance laser receiver can receive the parallel measuring laser beam emitted by the corresponding transmittance laser generator, then it can be judged that a wafer is parallel to bottom of a clamping jaw.

Preferably, the transmittance laser generator is a transmittance strip laser generator which emits a strip parallel measuring laser beam.

Preferably, the transmittance laser receiver is a transmittance strip laser receiver which receives the strip parallel measuring laser beam.

Preferably, the regression-reflection laser generator is a regression-reflection strip laser sensor which emits and receives a strip parallel measuring laser beam.

Preferably, the wafer detecting unit includes: at least one regression-reflection laser sensor and at least one reflector, and each regression-reflection laser sensor corresponds to one reflector; the regression-reflection laser sensor is electrically connected to the detection processing unit; the regression-reflection laser sensor emits a wafer detecting laser beam to the work plane, the wafer detecting laser beam is not blocked by the clamping jaw, the corresponding reflector reflects such emitted wafer detecting laser beam to the regression-reflection laser generator along original path, the regression-reflection laser generator receives such reflected wafer detecting laser beam and converts the optical signal of such received wafer detecting laser beam into the corresponding second electrical signal; the wafer detecting laser beams emitted by the different regression-reflection laser generators have different frequencies; if it can be deduced from the second electrical signal that the regression-reflection laser generator can't receive the wafer detecting laser beam it emitted, then it can be judged that a wafer is clamped by a clamping jaw.

Preferably, the wafer detecting unit includes a distance measuring laser sensor; the distance measuring laser sensor is electrically connected to the detection processing unit; the distance measuring laser sensor emits a wafer detecting laser beam to the work plane; the wafer detecting laser beam scatters in case of an obstacle; the distance measuring laser sensor receives such scattered wafer detecting laser beam and generates a distance value; if such distance value is below the distance threshold value preset in the detection processing unit, the detection processing unit will judge that a wafer is clamped by a clamping jaw.

Preferably, the wafer detecting unit includes: at least one transmittance laser generator and at least one transmittance laser receiver, and each transmittance laser receiver corresponds to one transmittance laser generator; the transmittance laser receiver is electrically connected to the detection processing unit; the transmittance laser generator emits a wafer detecting laser beam to the work plane, the wafer detecting laser beam is not blocked by the clamping jaw; the transmittance laser receiver receives such wafer detecting laser beam emitted by the corresponding transmittance laser generator and converts optical signal of such received wafer detecting laser beam into the corresponding second electrical signal; if it can be deduced from the second electrical signal that the transmittance laser receiver can't receive the wafer detecting laser beam emitted by the corresponding transmittance laser generator, then it can be judged that a wafer is clamped by a clamping jaw.

Preferably, the wafer detecting unit includes: at least one transmittance laser generator, at least one transmittance laser receiver and at least one reflector, and each transmittance laser generator corresponds to one transmittance laser receiver and one reflector; the transmittance laser receiver is electrically connected to the detection processing unit; the transmittance laser generator emits a wafer detecting laser beam to the work plane, the corresponding reflector reflects such emitted wafer detecting laser beam, the corresponding transmittance laser receiver receives such reflected wafer detecting laser beam and coverts optical signal of such received wafer detecting laser beam into the corresponding second electrical signal; both the emitted wafer detecting laser beams and the reflected wafer detecting laser beams are not blocked by the clamping jaw; if it can be deduced from the second electrical signal that the transmittance laser receiver can't receive the wafer detecting laser beam emitted by the corresponding transmittance laser generator, then it can be judged that a wafer is clamped by a clamping jaw.

The invention also discloses a wafer detection method, which is used for detecting whether a wafer is clamped by the clamping jaw inside a CMP cleaning and drying device and detecting whether the wafer is parallel to bottom of the clamping jaw; the wafer detection method can be realized with any of the wafer detection devices described in the invention; the wafer detection method includes following steps:

S1. The wafer detecting unit emits a wafer detecting laser beam to the work plane; the wafer detecting unit receives such emitted wafer detecting laser beam, coverts optical signal of such received wafer detecting laser beam into the second electrical signal or generates a distance value on basis of such received wafer detecting laser beam;

S2. The detection processing unit coverts the second electrical signal into the corresponding second digital signal, if value of the second digital signal is 0, the detection processing unit will judge that a wafer is clamped by a clamping jaw and enter S3; or the detection processing unit compares the distance value with the distance threshold value saved in the detection processing unit, if the distance value is below the distance threshold value, the detection processing unit will judge that a wafer is clamped by a clamping jaw and enter S3; otherwise, the detection processing unit will judge that no wafer is clamped by a clamping jaw;

S3. The wafer parallel measuring unit emits a parallel measuring laser beam having different frequencies and parallel to bottom of a clamping jaw; the distance between the parallel measuring laser beam and bottom of the clamping jaw match with the distance between the work plane and bottom of the clamping jaw; the wafer parallel measuring unit receives the parallel measuring laser beam and converts optical signal of such received parallel measuring laser beam into the corresponding first electrical signal; enter S4; and S4. The detection processing unit coverts the first electrical signal into the corresponding first digital signal, if value of the first digital signal is below the first threshold value saved in the detection processing unit, the detection processing unit will judge that a wafer is not parallel to bottom of a clamping jaw; otherwise, the detection processing unit will judge that a wafer is parallel to bottom of a clamping jaw.

Compared with existing technology, the invention has following advantages.

(1) The invention can detect whether a wafer is clamped by a clamping jaw inside a CMP cleaning and drying device and detect whether the wafer is parallel to bottom of the clamping jaw at the same time.

(2) The invention solves the issue about the inconsistent sensitivity of wafer parallel measurements over wafers tilting at different angles through layout of the parallel measuring laser beams.

(3) The invention eliminates impacts on detection accuracy caused by interferences among different parallel measuring laser beams by using light sources having different frequencies for parallel measuring laser beams.

(4) The invention judges whether a wafer is clamped by a clamping jaw by placing the distance measuring laser sensor above the wafer; the components below front of the wafer are removed, which eliminates interferences to sensor below the wafer caused by dripping of cleaning liquid, and therefore reduces detection errors.

(5) The invention further uses fewer sensors by adopting reflector(s), shortens system debugging time and cost, and reduces failures of the wafer detection devices under the invention.

(6) The wafer detection devices under the invention have no requirement on the way of placing wafers which can be clamped by clamping jaws and placed horizontally or vertically on work planes; all the wafer detection devices under the invention can detect whether a wafer exists or not and detect whether the wafer is parallel to bottom of the clamping jaw.

BRIEF DESCRIPTION OF THE DRAWINGS

The drawings included in the Description are briefly described below to clearly explain the technical schemes of the invention. It is obvious that the drawings described below are embodiments of the invention. For those skilled in the art, other drawings can be obtained according to following drawings without creative effort.

In figures: 1. Transmittance laser generator; 2. Transmittance laser receiver; 3. Clamping jaw; 4. Wafer; 5. Reflector; 6. Transmittance strip laser generator; 7. Transmittance strip laser receiver; 8. Bottom of clamping jaw; 9. Distance measuring laser sensor; 10. Regression-reflection laser sensor; 11. Regression-reflection strip laser sensor.

DESCRIPTION OF THE EMBODIMENTS

The technical schemes of embodiments under the invention are clearly and completely described below by combining figures. It is obvious that the embodiments described below are only partial instead of all embodiments under the invention. All the other embodiments, which are obtained without creative work by those skilled in the art upon embodiments of the invention, are within protection scope of the invention.

A wafer 4 is clamped by a clamping jaw 3 and placed inside a CMP cleaning and drying device; a periphery of the wafer 4 is clamped by a clamping part at a top of the clamping jaw, so that the wafer 4 placed on a work plane, the wafer 4 is parallel to a bottom 8 of the clamping jaw and there is a certain distance between the wafer 4 and the bottom 8 of the clamping jaw. The work plane is a plane onto which the wafer 4 shall be placed inside the CMP cleaning and drying device.

The invention provides a wafer detection device for detecting whether the wafer 4 is clamped by the clamping jaw 3 inside the CMP cleaning and drying device and detecting whether the wafer 4 is parallel to the bottom 8 of the clamping jaw; the wafer detection device includes: a wafer parallel measuring unit, a wafer detecting unit and a detection processing unit.

Figure 12:
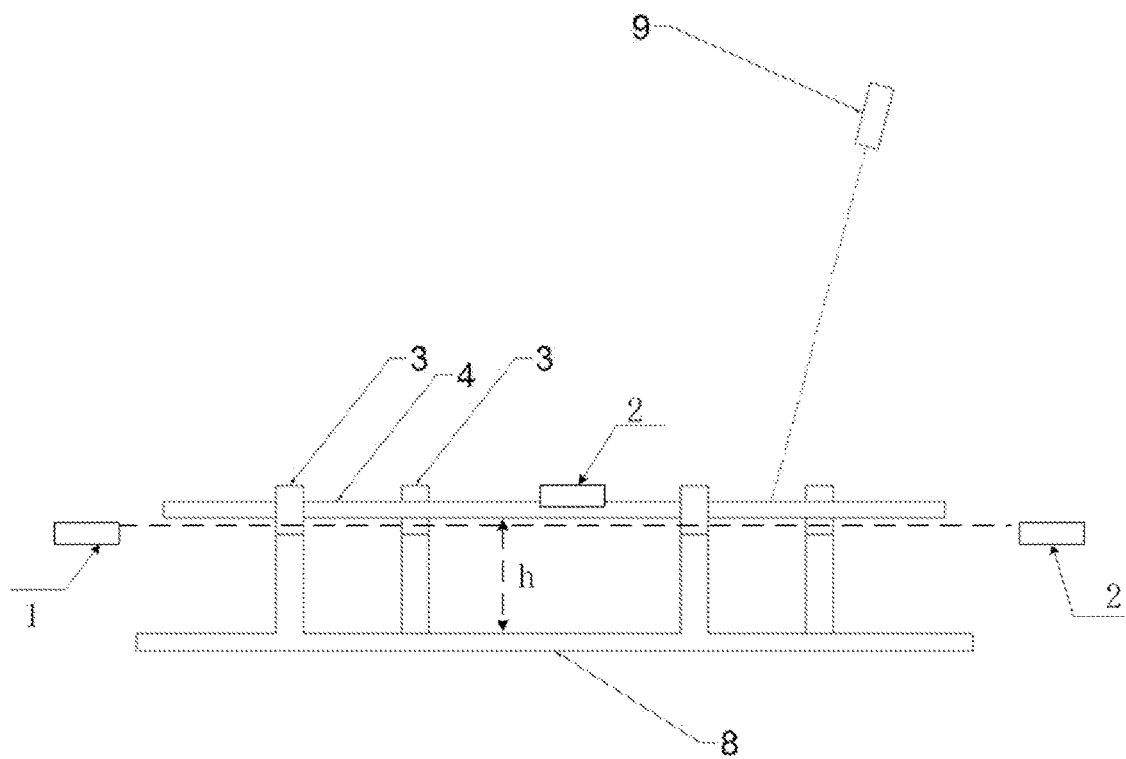
FIG. 12 is a side view of the wafer parallel measuring unit, the wafer and the clamping jaw in the eleventh embodiment under the invention.

The wafer parallel measuring unit is set inside a CMP cleaning and drying device and is used for emitting a parallel measuring laser beam parallel to the bottom 8 of the clamping jaw and receiving the parallel measuring laser beam; when the wafer 4 is parallel to the bottom 8 of the clamping jaw, the parallel measuring laser beam will not be blocked by the wafer 4; the optical signal of the received parallel measuring laser beam converted by the wafer parallel measuring unit is the corresponding first electrical signal. When the wafer 4 is placed parallel to the bottom 8 of the clamping jaw, in the first embodiment under the invention, the wafer 4 can be set between the parallel measuring laser beam and the bottom 8 of the clamping jaw. In the eleventh embodiment under the invention, as shown in FIG. 12, the parallel measuring laser beam can be set between the wafer 4 and the bottom 8 of the clamping jaw. The distance between the parallel measuring laser beam and the wafer 4 is short. The shorter the distance between the parallel measuring laser beam and the wafer 4 is, the better effect of detecting whether the wafer 4 is parallel to the bottom 8 of the clamping jaw will be.

The wafer detecting unit is set inside the CMP cleaning and drying device and is used for emitting a wafer detecting laser beam to work plane and receiving the wafer detecting laser beam; the wafer detecting unit converts the optical signal of received wafer detecting laser beam into the corresponding second electrical signal or generates a distance value on basis of such received wafer detecting laser beam.

The detection processing unit is electrically connected to the wafer parallel measuring unit and the wafer detecting unit; the detection processing unit judges whether the wafer 4 is parallel to the bottom 8 of the clamping jaw on basis of the first electrical signal; the detection processing unit judges whether the wafer 4 is clamped by the clamping jaw 3 on basis of the second electrical signal; the detection processing unit judges whether the wafer 4 is clamped by the clamping jaw 3 by comparing the distance value with preset distance threshold value.

Preferably, the wafer parallel measuring unit includes: at least one transmittance laser generator 1 and at least one transmittance laser receiver 2, and each transmittance laser receiver 2 corresponds to one transmittance laser generator 1. The transmittance laser receiver 2 is electrically connected to the detection processing unit. The transmittance laser generator 1 emits a parallel measuring laser beam. The parallel measuring laser beams emitted by different transmittance laser generators 1 have different frequencies, and each parallel measuring laser beam intersects with other parallel measuring laser beams. Preferably, the wafer parallel measuring unit includes two transmittance laser generators 1 and two transmittance laser receivers 2, and measurement effect of the wafer parallel measuring unit is the best when two parallel measuring laser beams are orthogonal.

The transmittance laser receiver 2 receives the parallel measuring laser beam emitted by the corresponding transmittance laser generator 1 and converts the optical signal of such received parallel measuring laser beam into the first electrical signal. The detection processing unit converts the first electrical signal into the corresponding first digital signal and compares the first digital signal with the first threshold value saved in the detection processing unit. When the wafer 4 is placed normally, the parallel measuring laser beam will not be blocked, the transmittance laser receiver 2 can receive the parallel measuring laser beam emitted by the corresponding transmittance laser generator 1. If the first digital signal is not below the first threshold value, the detection processing unit will judge that the wafer 4 is parallel to the bottom 8 of the clamping jaw. When the wafer 4 is placed not parallel to the bottom 8 of the clamping jaw, at least one parallel measuring laser beam will be blocked by the wafer 4, the transmittance laser receiver 2 corresponding to such blocked parallel measuring laser beam can't receive such blocked parallel measuring laser beam, if value of the first digital signal corresponding to such blocked parallel measuring laser beam is 0, the detection processing unit will judge that the wafer 4 is not parallel to the bottom 8 of the clamping jaw.

Figure 1:
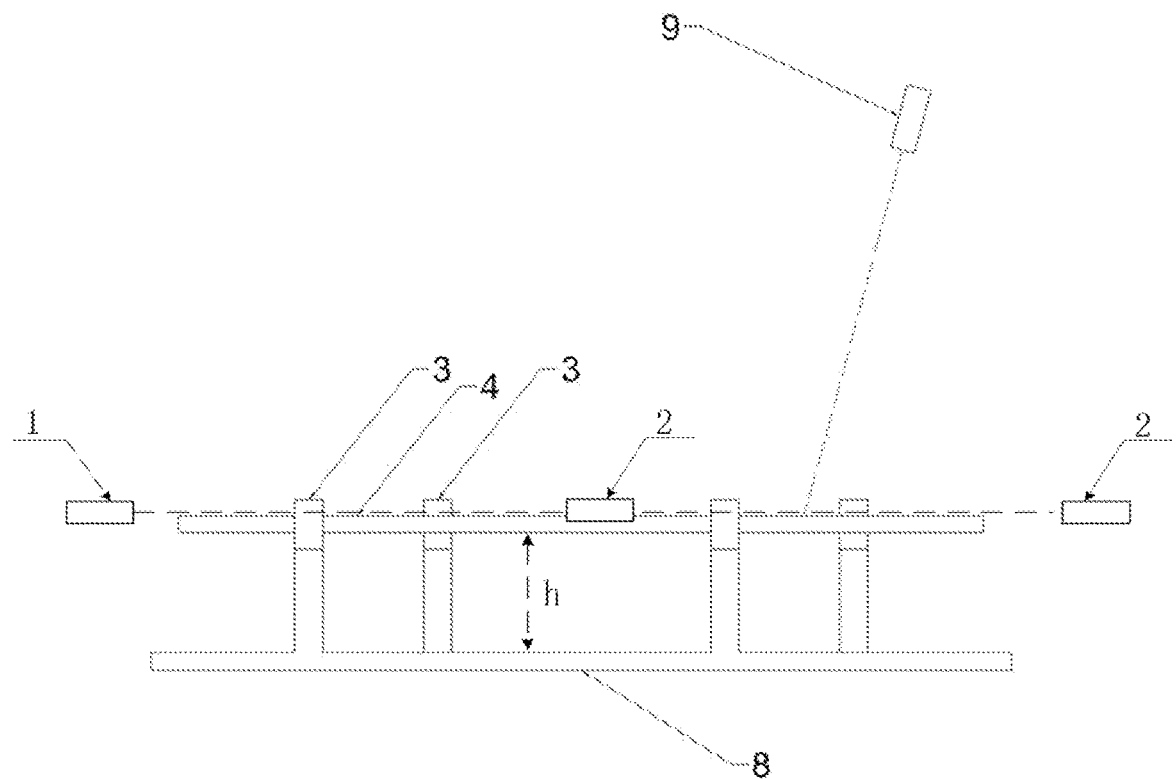
FIG. 1 is a side view of the wafer parallel measuring unit, the wafer detecting unit, the wafer and the clamping jaw in the first embodiment under the invention.
Figure 2:
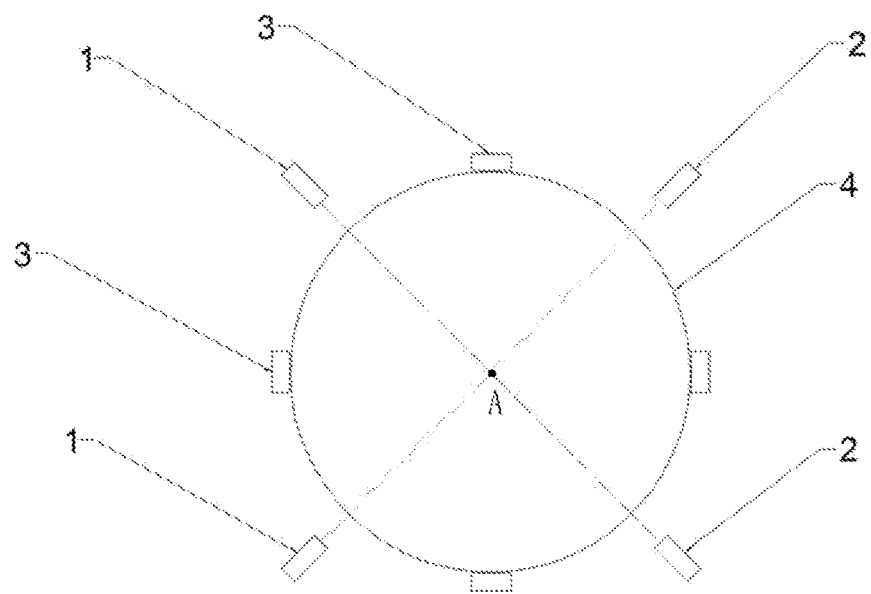
FIG. 2 is a top view of the wafer parallel measuring unit, the wafer and the clamping jaw in the first embodiment under the invention.

As shown in FIGS. 1 and 2, in the first embodiment under the invention, the wafer parallel measuring unit includes two transmittance laser generators 1 and two transmittance laser receivers 2. As shown in FIG. 2, two parallel measuring laser beams are parallel to the bottom 8 of the clamping jaw and are orthogonal, and the intersection point of the two parallel measuring laser beams projected on the wafer 4 falls on circle center A of the wafer 4. As shown in FIG. 1, there is a distance h between the work plane (the plane on which the wafer 4 is normally placed, as shown in FIG. 1) and the bottom 8 of the clamping jaw, and a distance between the parallel measuring laser beam and the bottom 8 of the clamping jaw is slightly larger than the distance h+wafer thickness.

Preferably, the wafer parallel measuring unit includes: at least one transmittance strip laser generator 6 which emits a strip parallel measuring laser beam; at least one transmittance strip laser receiver 7 which is electrically connected to the detection processing unit; each transmittance strip laser generator 6 corresponds to one transmittance strip laser receiver 7. The transmittance strip laser receiver 7 receives the parallel measuring laser beam emitted by the corresponding transmittance strip laser generator 6 and converts the optical signal of such received parallel measuring laser beam into the first electrical signal. The strip parallel measuring laser beam is parallel to the bottom 8 of the clamping jaw; the strip parallel measuring laser beams have different frequencies, and each strip parallel measuring laser beam intersects with other strip parallel measuring laser beams. Preferably, the wafer parallel measuring unit includes two transmittance strip laser generators 6 and two transmittance strip laser receivers 7, and measurement effect of the wafer parallel measuring unit is the best when two parallel measuring laser beams are orthogonal. The detection processing unit converts the first electrical signal into the corresponding first digital signal and judges whether the wafer 4 tilts and tilting angle of the wafer 4 on basis of the first digital signal.

Figure 3:
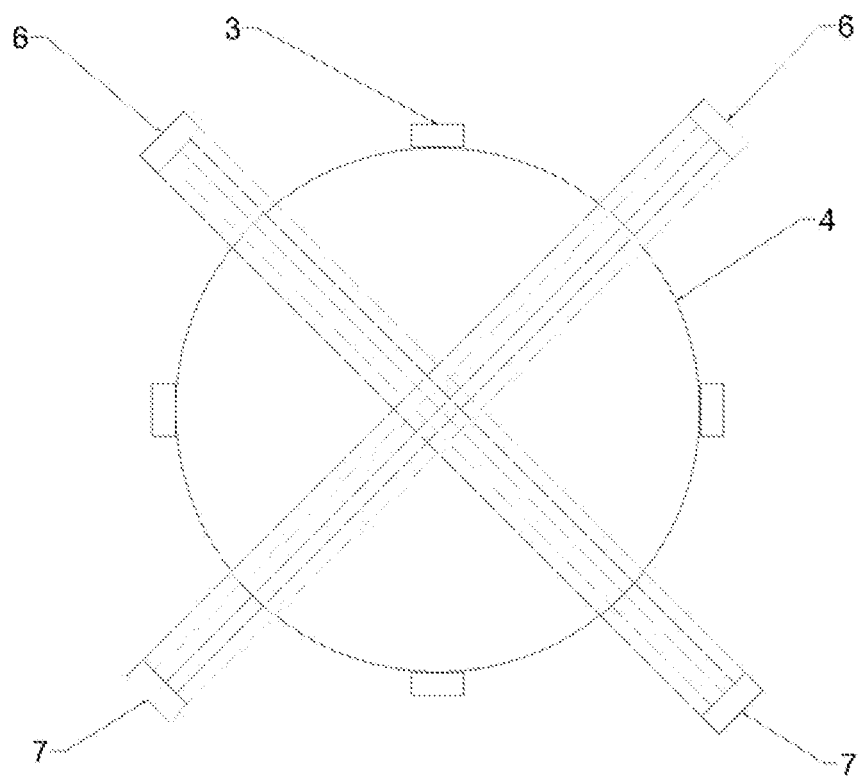
FIG. 3 is a top view of the wafer parallel measuring unit, the wafer and the clamping jaw in the second embodiment under the invention.

As shown in FIG. 3, in the second embodiment under the invention, the wafer parallel measuring unit includes: two transmittance strip laser generators 6 and two transmittance strip laser receivers 7. When the wafer 4 tilts, at least one strip parallel measuring laser beam will be fully or partially blocked by the wafer 4, if the first signal corresponding to such blocked strip parallel measuring laser beam is below the first threshold value preset in the detection processing unit, the detection processing unit will judge that the wafer 4 is not parallel to the bottom 8 of the clamping jaw. Meanwhile, the detection processing unit can judge tilting angle of the wafer 4 on basis of value of the first digital signal; the smaller value of the first digital signal is, the bigger tilting angle of the wafer 4 will be.

Preferably, the wafer parallel measuring unit includes: at least one regression-reflection laser generator and at least one reflector 5, and each regression-reflection laser generator corresponds to one reflector 5. The regression-reflection laser generator is electrically connected to the detection processing unit. The regression-reflection laser generator emits a parallel measuring laser beam, the corresponding reflector 5 reflects such emitted parallel measuring laser beam back to the regression-reflection laser generator along original path, the regression-reflection laser generator receives such reflected parallel measuring laser beam and converts the optical signal of such received parallel measuring laser beam into the corresponding first electrical signal. The detection processing unit coverts the first electrical signal into the corresponding first digital signal and judges whether the wafer 4 is parallel to the bottom 8 of the clamping jaw on basis of the first digital signal. The parallel measuring laser beams emitted by different regression-reflection laser generators have different frequencies, and each parallel measuring laser beam intersects with other strip parallel measuring laser beams.

Figure 4:
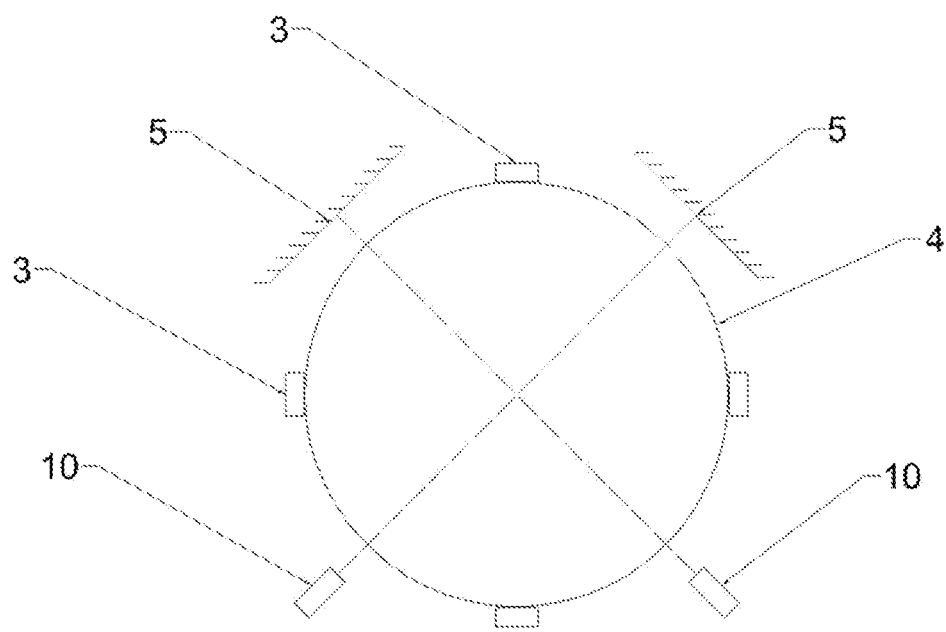
FIG. 4 is a top view of the wafer parallel measuring unit, the wafer and the clamping jaw in the third embodiment under the invention.

As shown in FIG. 4, in the third embodiment under the invention, the wafer parallel measuring unit includes two regression-reflection laser generators and two reflectors 5. When the wafer 4 tilts, at least one parallel measuring laser beam will blocked by the wafer 4, if value of the first signal corresponding to such blocked parallel measuring laser beam is 0, the detection processing unit will judge that the wafer 4 is not parallel to the bottom 8 of the clamping jaw.

Preferably, the wafer parallel measuring unit includes: at least one regression-reflection strip laser sensor 11 and at least one reflector 5. The regression-reflection strip laser sensor 11 is electrically connected to the detection processing unit. The regression-reflection strip laser sensor 11 emits a strip parallel measuring laser beam, corresponding reflector 5 reflects such emitted strip parallel measuring laser beam back to the regression-reflection laser generator along original path, the regression-reflection laser generator receives such reflected strip parallel measuring laser beam and converts the optical signal of such received strip parallel measuring laser beam into the corresponding first electrical signal. The strip parallel measuring laser beams emitted by different regression-reflection strip laser sensors 11 have different frequencies, and each strip parallel measuring laser beam intersects with other strip parallel measuring laser beams. Preferably, the wafer parallel measuring unit includes two regression-reflection strip laser sensors 11 and two reflectors 5, and measurement effect of the wafer parallel measuring unit is the best when two parallel measuring laser beams are orthogonal. The detection processing unit converts the first electrical signal into the corresponding first digital signal and judges whether the wafer 4 is parallel to the bottom 8 of the clamping jaw on basis of the first digital signal.

Figure 5:
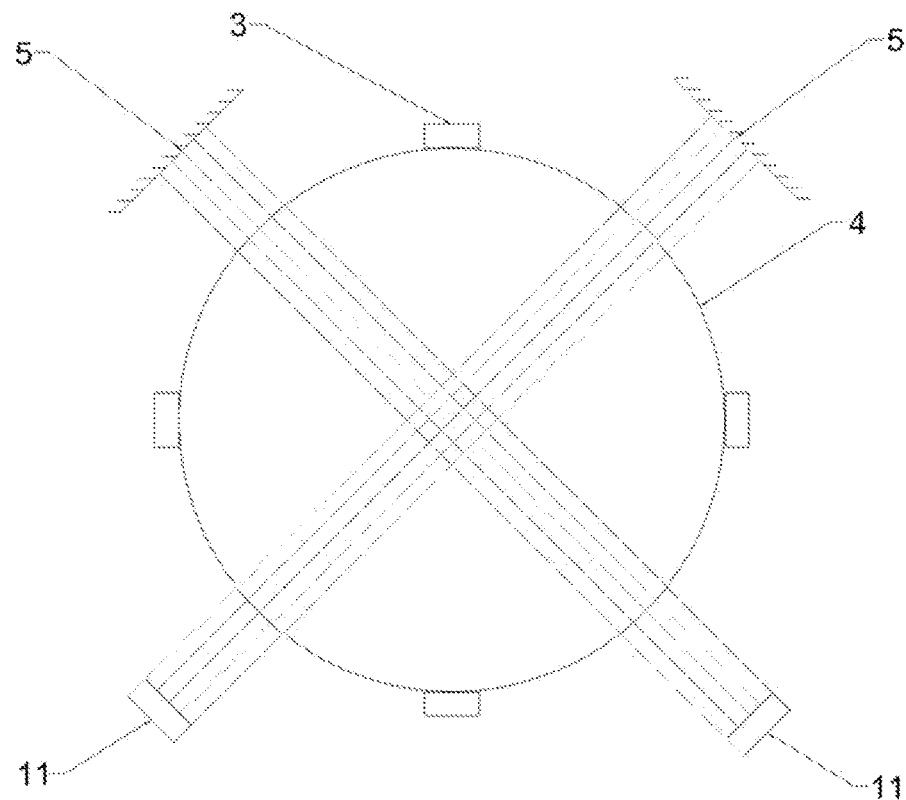
FIG. 5 is a top view of the wafer parallel measuring unit, the wafer and the clamping jaw in the fourth embodiment under the invention.

As shown in FIG. 5, in the fourth embodiment under the invention, the wafer parallel measuring unit includes two regression-reflection strip laser sensors 11 and two reflectors 5. When the wafer 4 tilts, at least one strip parallel measuring laser beam will be fully or partially blocked by the wafer 4. If the first signal corresponding to such blocked strip parallel measuring laser beam is below the first threshold value preset in the detection processing unit, the detection processing unit will judge that the wafer 4 is not parallel to the bottom 8 of the clamping jaw and will judge tilting angle of the wafer 4.

Preferably, the wafer parallel measuring unit includes: at least one transmittance laser generator 1, at least one transmittance laser receiver 2 and at least one reflector 5. Each transmittance laser generator 1 corresponds to one transmittance laser receiver 2 and one reflector 5. The transmittance laser generator 1 emits a parallel measuring laser beam, the reflector 5 reflects such emitted parallel measuring laser beam, the corresponding transmittance laser receiver 2 receives such reflected parallel measuring laser beam and converts the optical signal of such received parallel measuring laser beam into the corresponding first electrical signal. The detection processing unit converts the first electrical signal into the corresponding digital signal and judges whether the wafer 4 is parallel to the bottom 8 of the clamping jaw on basis of the first digital signal. The parallel measuring laser beams emitted by different transmittance laser generators 1 have different frequencies; both the parallel measuring laser beams emitted by the transmittance laser generator 1 and reflected by the reflector 5 are parallel to the bottom 8 of the clamping jaw and a distance between the parallel measuring laser beams emitted by the transmittance laser generator 1 and the bottom 8 of the clamping jaw and a distance between the parallel measuring laser beams reflected by the reflector 5 and the bottom 8 of the clamping jaw are the same.

Figure 6:
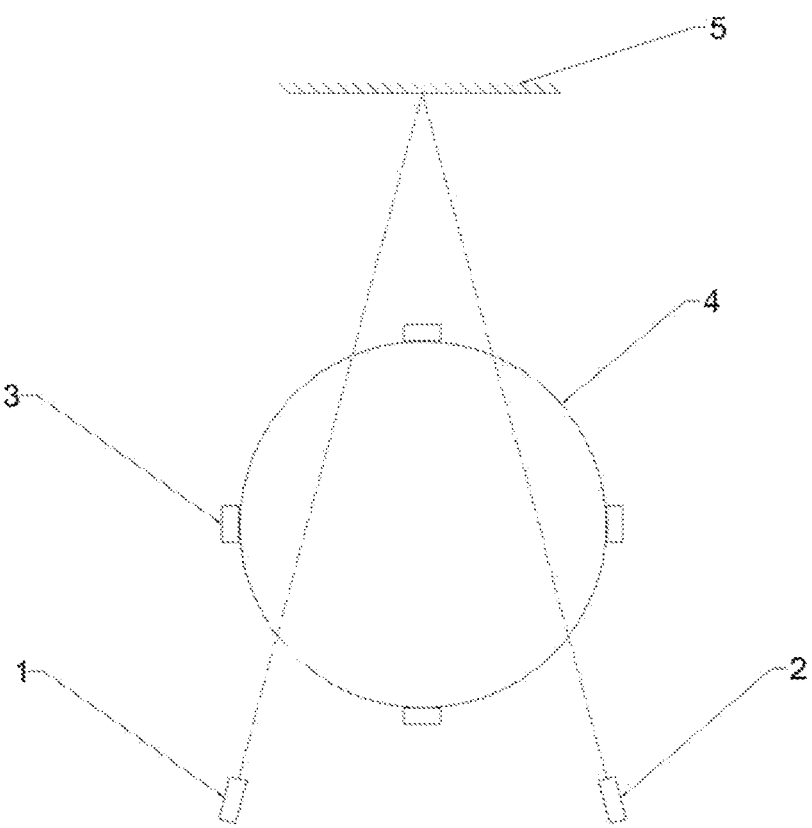
FIG. 6 is a top view of the wafer parallel measuring unit, the wafer and the clamping jaw in the fifth embodiment under the invention.

As shown in FIG. 6, in the fifth embodiment under the invention, the wafer parallel measuring unit includes one transmittance laser generator 1, one transmittance laser receiver 2 and one reflector 5. When the wafer 4 tilts, the emitted parallel measuring laser beam is blocked by the wafer 4, if the transmittance laser receiver 2 can't receive optical signal and value of the first digital signal is 0, the detection processing unit will judge that the wafer 4 is not parallel to the bottom 8 of the clamping jaw.

Preferably, the wafer detecting unit includes a distance measuring laser sensor 9; the distance measuring laser sensor 9 is electrically connected to the detection processing unit. The distance measuring laser sensor 9 emits a wafer detecting laser beam to the work plane; the wafer detecting laser beam scatters in case of an obstacle; the distance measuring laser sensor 9 receives such scattered wafer detecting laser beam and generates a distance value. The detection processing unit will judge whether the wafer 4 is clamped by the clamping jaw 3 on basis of the distance value.

Figure 7:
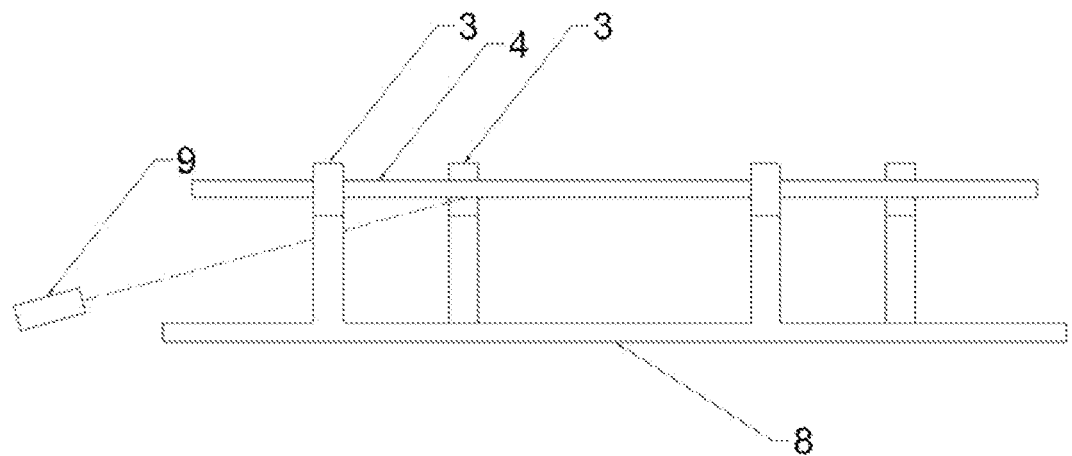
FIG. 7 is a side view of the wafer detecting unit, the wafer and the clamping jaw in the sixth embodiment under the invention.

As shown in FIG. 1, in the first embodiment under the invention, the distance measuring laser sensor 9 is set above the wafer 4, when the wafer 4 is on the work plane, the distance measuring laser sensor 9 will obtain value of the distance from it to the wafer 4; when the wafer 4 is not on the work plane, the distance measuring laser sensor 9 will obtain value of the distance from it to the bottom 8 of the clamping jaw. As shown in FIG. 7, in the sixth embodiment under the invention, the distance measuring laser sensor 9 is set below the wafer 4, when the wafer 4 is on the work plane, the distance measuring laser sensor 9 will obtain value of the distance from it to the wafer 4, if such distance value is below the distance threshold value preset in the detection processing unit, the detection processing unit will judge that the wafer 4 is clamped by the clamping jaw 3; when the wafer 4 is not on the work plane, the distance measuring laser sensor 9 will obtain value of the distance from it to top of the CMP cleaning and drying device, if such distance value is above the distance threshold value preset in the detection processing unit, the detection processing unit will judge that no wafer 4 is clamped by the clamping jaw 3.

Preferably, the wafer detecting unit includes at least one regression-reflection laser sensor 10 and at least one reflector 5, and each regression-reflection laser sensor 10 corresponds to one reflector 5; the regression-reflection laser sensor 10 is electrically connected to the detection processing unit; the regression-reflection laser sensor 10 emits a wafer detecting laser beam to the work plane, the wafer detecting laser beam is not blocked by the clamping jaw 3, the corresponding reflector 5 reflects such emitted wafer detecting laser beam to the regression-reflection laser generator along original path, the regression-reflection laser generator receives such reflected wafer detecting laser beam and converts the optical signal of such received wafer detecting laser beam into the corresponding second electrical signal; the wafer detecting laser beams emitted by different regression-reflection laser generators havr different frequencies. The detection processing unit converts the second electrical signal into the corresponding second digital signal and judges whether the wafer 4 is clamped by the clamping jaw 3 on basis of the second digital signal.

Figure 8:
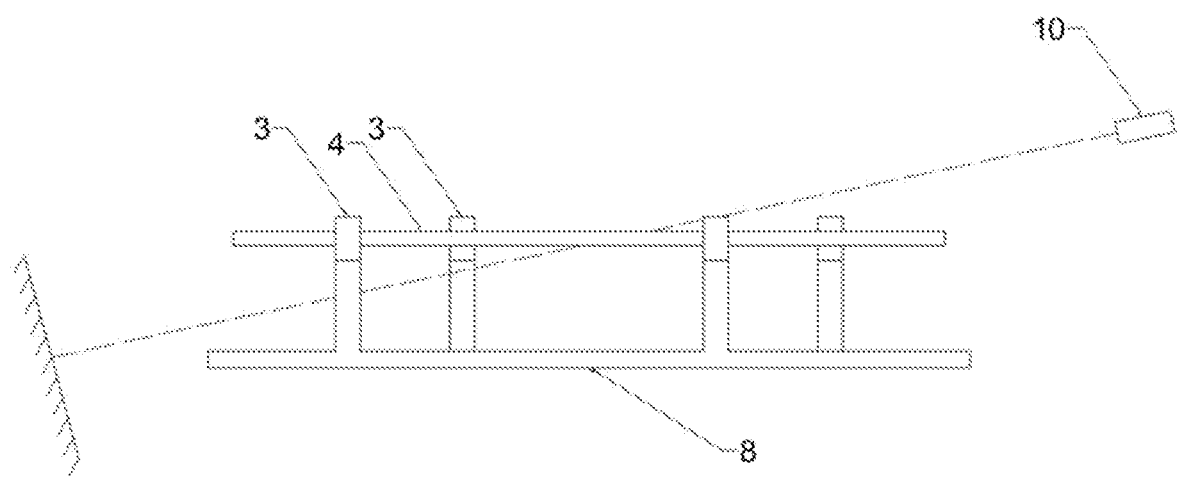
FIG. 8 is a side view of the wafer detecting unit, the wafer and the clamping jaw in the seventh embodiment under the invention.
Figure 9:
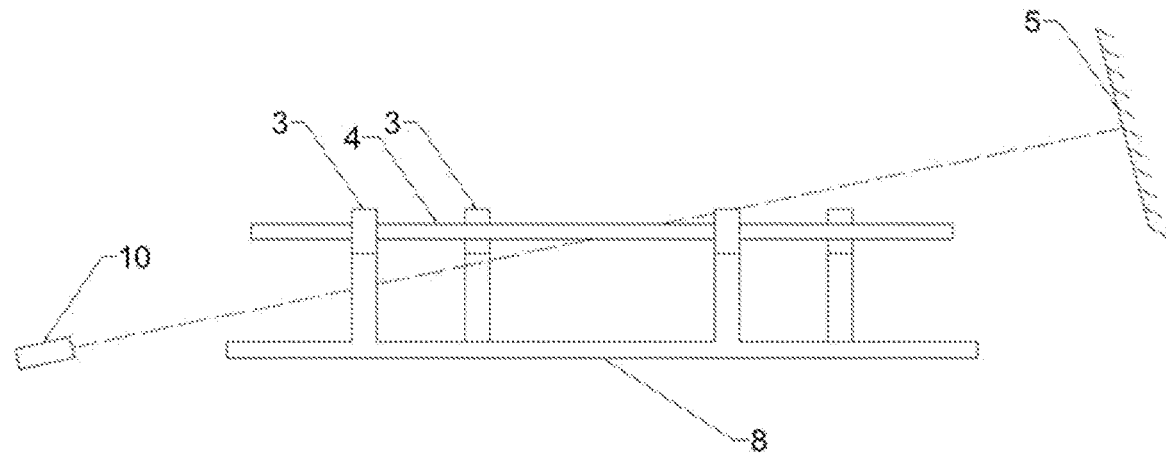
FIG. 9 is a side view of the wafer detecting unit, the wafer and the clamping jaw in the eighth embodiment under the invention.

As shown in FIG. 8, in the seventh embodiment under the invention, the regression-reflection laser sensor 10 emits the wafer detecting laser beam from above the work plane to the work plane. As shown in FIG. 9, in the eighth embodiment under the invention, the regression-reflection laser sensor 10 emits the wafer detecting laser beam from below the work plane to the work plane. When the wafer 4 is clamped by the clamping jaw 3, if the wafer detecting laser beam emitted by the regression-reflection laser sensor 10 is blocked by the wafer 4, value of the second electrical signal received by the egression-reflection laser sensor 10 will be 0, and value of the corresponding second digital signal will also be 0, the detection processing unit will judge that no wafer 4 is clamped the clamping jaw 3.

Preferably, the wafer detecting unit includes: at least one transmittance laser generator 1 and at least one transmittance laser receiver 2, and each transmittance laser receiver 2 corresponds to one transmittance laser generator 1; the transmittance laser receiver 2 is electrically connected to the detection processing unit; the transmittance laser generator 1 emits a wafer detecting laser beam to the work plane, the wafer detecting laser beam is not blocked by the clamping jaw 3; the transmittance laser receiver 2 receives such wafer detecting laser beam emitted by the corresponding transmittance laser generator 1 and converts optical signal of such received wafer detecting laser beam into the corresponding second electrical signal. The detection processing unit converts the second electrical signal into the corresponding second digital signal and judges whether the wafer 4 is clamped by the clamping jaw 3 on basis of the second digital signal.

Figure 10:
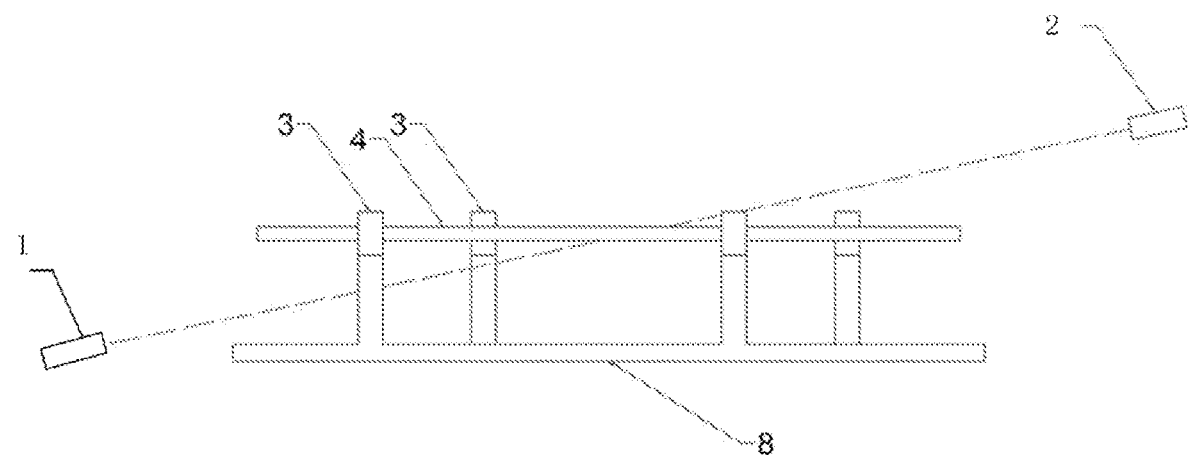
FIG. 10 is a side view of the wafer detecting unit, the wafer and the clamping jaw in the ninth embodiment under the invention.

As shown in FIG. 10, the ninth embodiment under the invention includes one transmittance laser generator 1 and one transmittance laser receiver 2. When the wafer 4 is clamped by the clamping jaw 3, if the wafer detecting laser beam emitted by the transmittance laser generator 1 is blocked by the wafer 4, value of the second electrical signal received by the transmittance laser receiver 2 will be 0, and value of the corresponding second digital signal will also be 0, the detection processing unit will judge that no wafer 4 is clamped the clamping jaw 3.

Preferably, the wafer detecting unit includes: at least one transmittance laser generator 1, at least one transmittance laser receiver 2 and at least one reflector 5, and each transmittance laser generator 1 corresponds to one transmittance laser receiver 2 and one reflector 5; the transmittance laser receiver 2 is electrically connected to the detection processing unit; the transmittance laser generator 1 emits a wafer detecting laser beam to the work plane, the corresponding reflector 5 reflects such emitted wafer detecting laser beam, the corresponding transmittance laser receiver 2 receives such reflected wafer detecting laser beam and coverts optical signal of such received wafer detecting laser beam into the corresponding second electrical signal; both emitted and reflected wafer detecting laser beams are not blocked by the clamping jaw 3. The detection processing unit converts the second electrical signal into the corresponding second digital signal and judges whether the wafer 4 is clamped by the clamping jaw 3 on basis of the second digital signal.

Figure 11:
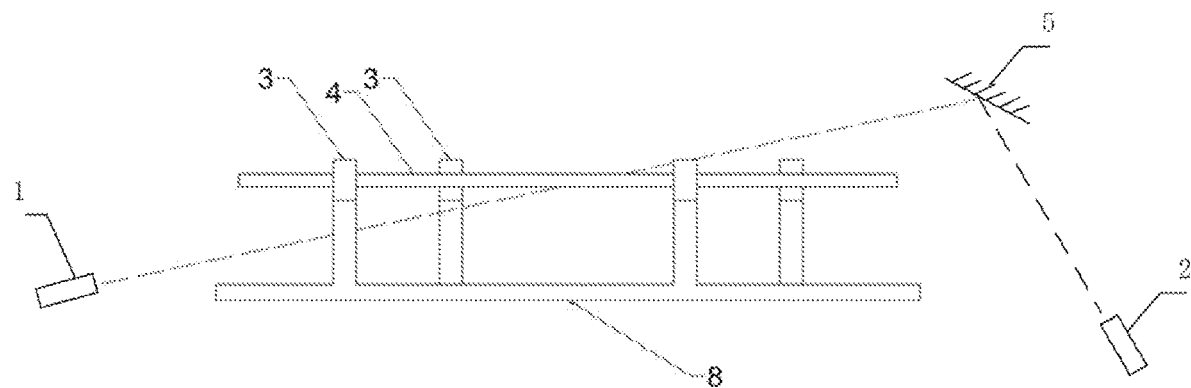
FIG. 11 is a side view of the wafer detecting unit, the wafer and the clamping jaw in the tenth embodiment under the invention.

As shown in FIG. 11, the tenth embodiment under the invention consists one transmittance laser generator 1, one transmittance laser receiver 2 and one reflector 5. When the wafer 4 is clamped by the clamping jaw 3, if the wafer detecting laser beam emitted by the transmittance laser generator 1 is blocked by the wafer 4, value of the second electrical signal received by the transmittance laser receiver 2 will be 0, the detection processing unit will judge that no wafer 4 is clamped the clamping jaw 3.

Figure 13:
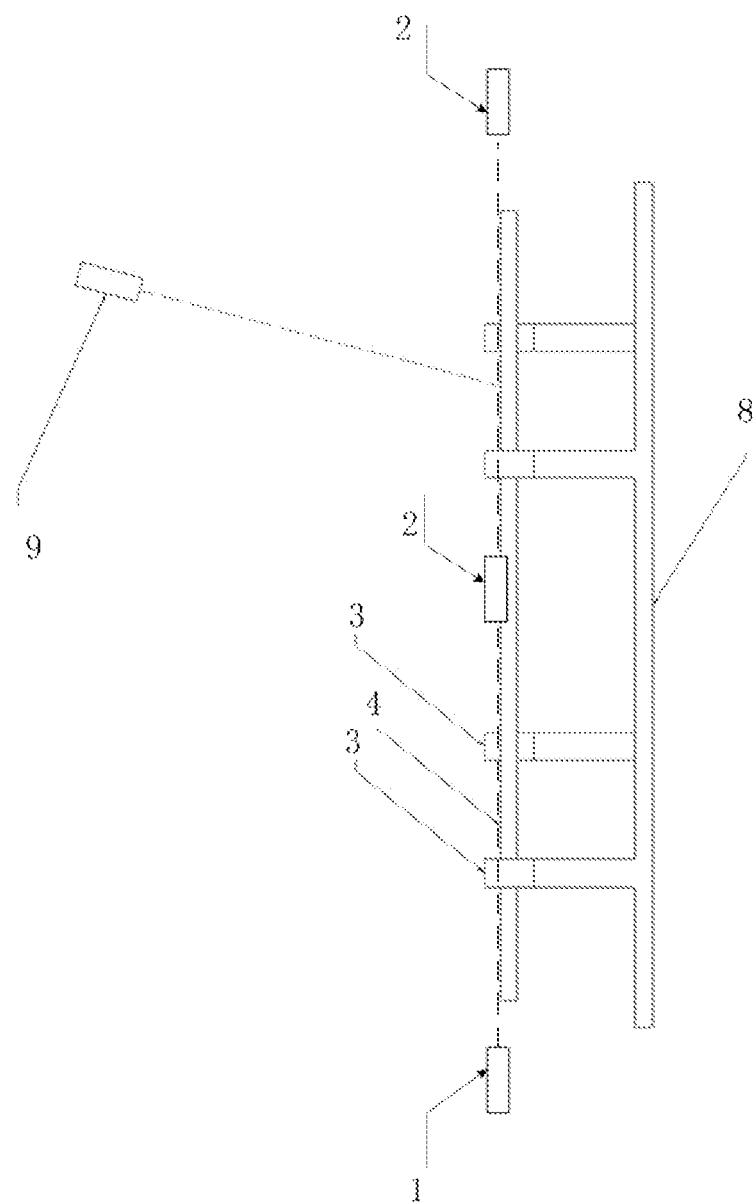
FIG. 13 is a top view of the wafer parallel measuring unit, the wafer detecting unit, the wafer and the clamping jaw in the twelfth embodiment under the invention.

As shown in FIG. 13, in the twelfth embodiment under the invention, the wafer is clamped by the clamping jaw and vertically placed in the CMP cleaning and drying device, the bottom 8 of the clamping jaw is vertical to the horizontal plane. In the embodiment, it is measured with transmittance laser generator 1 and transmittance laser receiver 2 whether the wafer 4 is parallel to the bottom 8 of the clamping jaw; it is detected with the distance measuring laser sensor 9 whether the wafer 4 is clamped by the clamping jaw 3. It can be told from FIG. 13 that, when the wafer 4 is vertically placed on the work plane, it can still be detected with the wafer detection device under the invention whether the wafer 4 is parallel to the bottom 8 of the clamping jaw.

The invention also discloses a wafer detection method, which is used for detecting whether the wafer 4 is clamped by the clamping jaw 3 inside the CMP cleaning and drying device and whether the wafer 4 is parallel to the bottom 8 of the clamping jaw; the wafer detection method can be realized with any of the wafer detection devices described in the invention; the wafer detection method contains following steps:

S1. the wafer detecting unit emits a wafer detecting laser beam to the work plane; the wafer detecting unit receives such emitted wafer detecting laser beam, coverts optical signal of such received wafer detecting laser beam into the second electrical signal or generates a distance value on basis of such received wafer detecting laser beam;

S2. the detection processing unit coverts the second electrical signal into the corresponding second digital signal, if value of the second digital signal is 0, the detection processing unit will judge that the wafer 4 is clamped by the clamping jaw 3 and enter S3; or the detection processing unit compares the distance value with the distance threshold value saved in the detection processing unit, if the distance value is below the distance threshold value, the detection processing unit will judge that the wafer 4 is clamped by the clamping jaw 3 and enter S3; otherwise, the detection processing unit will judge that no wafer 4 is clamped by the clamping jaw 3;

S3. the wafer parallel measuring unit emits a parallel measuring laser beam having different frequencies and parallel to the bottom 8 of a clamping jaw; the distance between the parallel measuring laser beam and the bottom 8 of the clamping jaw match with the distance between the work plane and the bottom 8 of the clamping jaw; the wafer parallel measuring unit receives the parallel measuring laser beam and converts optical signal of such received parallel measuring laser beam into the corresponding first electrical signal; enter S4; and S4. the detection processing unit coverts the first electrical signal into the corresponding first digital signal, if value of the first digital signal is below the first threshold value saved in the detection processing unit, the detection processing unit will judge that the wafer 4 is not parallel to the bottom 8 of the clamping jaw; otherwise, the detection processing unit will judge that the wafer 4 is parallel to the bottom 8 of the clamping jaw.

Compared with existing technology, the invention has following advantages.

(1) The invention can detect whether the wafer 4 is clamped by the clamping jaw 3 inside the CMP cleaning and drying device and detect whether the wafer 4 is parallel to the bottom 8 of the clamping jaw at the same time.

(2) The invention solves the issue about the inconsistent sensitivity of wafer parallel measurements over wafers 4 tilting at different angles through layout of the parallel measuring laser beams.

(3) The invention eliminates impacts on detection accuracy caused by interferences among different parallel measuring laser beams by using light sources having different frequencies for parallel measuring laser beams.

(4) The invention judges whether a wafer is clamped by a clamping jaw by placing the distance measuring laser sensor 9 above the wafer 4; the components below front of the wafer 4 are removed, which eliminates interferences to sensor below the wafer caused by dripping of cleaning liquid, and therefore reduces detection errors.

(5) The invention further uses fewer sensors by adopting reflector(s) 5, shortens system debugging time and cost, and reduces failures of the wafer detection devices under the invention.

(6) The wafer detection devices under the invention have no requirement on the way of placing wafers 4 which can be clamped by clamping jaws 3 and placed horizontally or vertically on work planes; all the wafer detection devices under the invention can detect whether a wafer exists or not and detect whether the wafer is parallel to the bottom of the clamping jaw.

Protection scope of the invention is beyond above embodiments under the invention. Various equivalent modifications or substitutions can be easily figured out by those skilled in the art within the technical range disclosed by the invention, such modifications and substitutions shall be within protection scope of the invention. Therefore, protection scope of the invention shall be protection scope of the claims.

What is claimed is:

1. A wafer detection device, a wafer is static and placed inside a CMP cleaning and drying device by a clamping jaw; a periphery of the wafer is clamped by a clamping part at a top of the clamping jaw and placed on a work plane, the wafer is parallel to a bottom of the clamping jaw and there is a certain distance between the wafer and the bottom of the clamping jaw; the wafer detection device is used for detecting whether the wafer is clamped by the clamping jaw inside the CMP cleaning and drying device and detecting whether the wafer is parallel to the bottom of the clamping jaw; wherein the wafer detection device includes:

a wafer parallel measuring unit, which is set inside the CMP cleaning and drying device and is used for emitting a parallel measuring laser beam have different frequencies parallel to the bottom of the clamping jaw and receiving the parallel measuring laser beam; when the wafer is parallel to the bottom of the clamping jaw, the parallel measuring laser beam will not be blocked by the wafer; an optical signal of the received parallel measuring laser beam converted by the wafer parallel measuring unit corresponds to a first electrical signal;

a wafer detecting unit, which is set inside the CMP cleaning and drying device and is used for emitting a wafer detecting laser beam to the wafer and receiving the wafer detecting laser beam; an optical signal of the received wafer detecting laser beam converted by the wafer detecting unit corresponds to a second electrical signal, or a distance value will be generated on basis of the optical signal of the received wafer detecting laser beam; and a detection processing unit, which is electrically connected to the wafer parallel measuring unit and the wafer detecting unit; the detection processing unit judges whether the wafer is parallel to the bottom of a clamping jaw on basis of the first electrical signal; the detection processing unit judges whether the wafer is clamped by the clamping jaw on basis of the second electrical signal; or the detection processing unit judges whether the wafer is clamped by the clamping jaw by comparing the distance value with a preset distance threshold value, wherein the wafer detecting unit includes a distance measuring laser sensor located above the wafer.

2. The wafer detection device according to claim 1, wherein the wafer parallel measuring unit includes: at least one transmittance laser generator and at least one transmittance laser receiver, and each transmittance laser receiver corresponds to one transmittance laser generator; the transmittance laser receiver is electrically connected to the detection processing unit; the transmittance laser generator emits the parallel measuring laser beam, the parallel measuring laser beams emitted by the different transmittance laser generators have different frequencies, and each parallel measuring laser beam intersects with other parallel measuring laser beams; the transmittance laser receiver receives the parallel measuring laser beam emitted by the corresponding transmittance laser generator and converts the optical signal of the received parallel measuring laser beam into the corresponding first electrical signal; if it can be deduced from the first electrical signal that the transmittance laser receiver can receive the parallel measuring laser beam emitted by the corresponding transmittance laser generator, then it can be judged that the wafer is parallel to the bottom of the clamping jaw.

3. A wafer detection method realized with the wafer detection devices according to claim 2, which is used for detecting whether the wafer is clamped by the clamping jaw inside the CMP cleaning and drying device and whether the wafer is parallel to the bottom of the clamping jaw, and including following steps:

step S1, the wafer detecting unit emits a wafer detecting laser beam to the work plane; the wafer detecting unit receives the emitted wafer detecting laser beam, coverts the optical signal of the received wafer detecting laser beam into the second electrical signal or generates the distance value on basis of the received wafer detecting laser beam;

step S2, the detection processing unit coverts the second electrical signal into a second digital signal corresponding to which, if a value of the second digital signal is 0, the detection processing unit will judge that the wafer is clamped by the clamping jaw and enter step S3; or the detection processing unit compares the distance value with the distance threshold value saved in the detection processing unit, if the distance value is below the distance threshold value, the detection processing unit will judge that the wafer is clamped by the clamping jaw and enter the step S3; otherwise, the detection processing unit will judge that no wafer is clamped by the clamping jaw;

the step S3, the wafer parallel measuring unit emits the parallel measuring laser beam having different frequencies and parallel to the bottom of the clamping jaw; a distance between the parallel measuring laser beam and the bottom of the clamping jaw match with a distance between the work plane and the bottom of the clamping jaw; the wafer parallel measuring unit receives the parallel measuring laser beam and converts the optical signal of the received parallel measuring laser beam into the corresponding first electrical signal; enter step S4; and the step S4, the detection processing unit coverts the first electrical signal into a first digital signal corresponding to which, if a value of the first digital signal is below a first threshold value saved in the detection processing unit, the detection processing unit will judge that the wafer is not parallel to the bottom of the clamping jaw; otherwise, the detection processing unit will judge that the wafer is parallel to the bottom of the clamping jaw.

4. The wafer detection device according to claim 1, wherein the wafer parallel measuring unit includes: at least one regression-reflection laser generator and at least one reflector, and each regression-reflection laser generator corresponds to one reflector; the regression-reflection laser generator is electrically connected to the detection processing unit; the regression-reflection laser generator emits the parallel measuring laser beam, the corresponding reflector reflects the emitted parallel measuring laser beam back to the regression-reflection laser generator along an original path, the regression-reflection laser generator receives the reflected parallel measuring laser beam and converts the optical signal of the received parallel measuring laser beam into the corresponding first electrical signal; the parallel measuring laser beams emitted by the different regression-reflection laser generators have different frequencies, and each parallel measuring laser beam intersects with other parallel measuring laser beams; if it can be deduced from the first electrical signal that the regression-reflection laser generator can receive the parallel measuring laser beam it emitted, then it can be judged that the wafer is parallel to the bottom of the clamping jaw.

5. A wafer detection method realized with the wafer detection devices according to claim 3, which is used for detecting whether the wafer is clamped by the clamping jaw inside the CMP cleaning and drying device and whether the wafer is parallel to the bottom of the clamping jaw, and including following steps:

step S1, the wafer detecting unit emits a wafer detecting laser beam to the work plane; the wafer detecting unit receives the emitted wafer detecting laser beam, coverts the optical signal of the received wafer detecting laser beam into the second electrical signal or generates the distance value on basis of the received wafer detecting laser beam;

step S2, the detection processing unit coverts the second electrical signal into a second digital signal corresponding to which, if a value of the second digital signal is 0, the detection processing unit will judge that the wafer is clamped by the clamping jaw and enter step S3; or the detection processing unit compares the distance value with the distance threshold value saved in the detection processing unit, if the distance value is below the distance threshold value, the detection processing unit will judge that the wafer is clamped by the clamping jaw and enter the step S3; otherwise, the detection processing unit will judge that no wafer is clamped by the clamping jaw;

the step S3, the wafer parallel measuring unit emits the parallel measuring laser beam having different frequencies and parallel to the bottom of the clamping jaw; a distance between the parallel measuring laser beam and the bottom of the clamping jaw match with a distance between the work plane and the bottom of the clamping jaw; the wafer parallel measuring unit receives the parallel measuring laser beam and converts the optical signal of the received parallel measuring laser beam into the corresponding first electrical signal; enter step S4; and the step S4, the detection processing unit coverts the first electrical signal into a first digital signal corresponding to which, if a value of the first digital signal is below a first threshold value saved in the detection processing unit, the detection processing unit will judge that the wafer is not parallel to the bottom of the clamping jaw; otherwise, the detection processing unit will judge that the wafer is parallel to the bottom of the clamping jaw.

6. The wafer detection device according to claim 1, wherein the wafer parallel measuring unit includes: at least one transmittance laser generator, at least one transmittance laser receiver and at least one reflector, and each transmittance laser generator corresponds to one transmittance laser receiver and one reflector; the transmittance laser generator emits the parallel measuring laser beam, the reflector reflects the emitted parallel measuring laser beam, the corresponding transmittance laser receiver receives the reflected parallel measuring laser beam and converts the optical signal of the received parallel measuring laser beam into the corresponding first electrical signal; the parallel measuring laser beams emitted by the different transmittance laser generators have different frequencies; both the parallel measuring laser beams emitted by the transmittance laser generator and reflected by the reflector are parallel to the bottom of the clamping jaw and a distance between the parallel measuring laser beams emitted by the transmittance laser generator and the bottom of the clamping jaw and a distance between the parallel measuring laser beams reflected by the reflector and the bottom of the clamping jaw are the same; if it can be deduced from the first electrical signal that the transmittance laser receiver can receive the parallel measuring laser beam emitted by the corresponding transmittance laser generator, then it can be judged that the wafer is parallel to the bottom of the clamping jaw.

7. A wafer detection method realized with the wafer detection devices according to claim 4, which is used for detecting whether the wafer is clamped by the clamping jaw inside the CMP cleaning and drying device and whether the wafer is parallel to the bottom of the clamping jaw, and including following steps:

step S1, the wafer detecting unit emits a wafer detecting laser beam to the work plane; the wafer detecting unit receives the emitted wafer detecting laser beam, coverts the optical signal of the received wafer detecting laser beam into the second electrical signal or generates the distance value on basis of the received wafer detecting laser beam;

step S2, the detection processing unit coverts the second electrical signal into a second digital signal corresponding to which, if a value of the second digital signal is 0, the detection processing unit will judge that the wafer is clamped by the clamping jaw and enter step S3; or the detection processing unit compares the distance value with the distance threshold value saved in the detection processing unit, if the distance value is below the distance threshold value, the detection processing unit will judge that the wafer is clamped by the clamping jaw and enter the step S3; otherwise, the detection processing unit will judge that no wafer is clamped by the clamping jaw;

the step S3, the wafer parallel measuring unit emits the parallel measuring laser beam having different frequencies and parallel to the bottom of the clamping jaw; a distance between the parallel measuring laser beam and the bottom of the clamping jaw match with a distance between the work plane and the bottom of the clamping jaw; the wafer parallel measuring unit receives the parallel measuring laser beam and converts the optical signal of the received parallel measuring laser beam into the corresponding first electrical signal; enter step S4; and the step S4, the detection processing unit coverts the first electrical signal into a first digital signal corresponding to which, if a value of the first digital signal is below a first threshold value saved in the detection processing unit, the detection processing unit will judge that the wafer is not parallel to the bottom of the clamping jaw; otherwise, the detection processing unit will judge that the wafer is parallel to the bottom of the clamping jaw.

8. The wafer detection device according to claim 1, wherein the detecting unit includes: at least one regression-reflection laser sensor and at least one reflector, and each regression-reflection laser sensor corresponds to one reflector; the regression-reflection laser sensor is electrically connected to the detection processing unit; the regression-reflection laser sensor emits a wafer detecting laser beam to the work plane, the wafer detecting laser beam is not blocked by the clamping jaw, the corresponding reflector reflects the emitted wafer detecting laser beam to the regression-reflection laser generator along an original path, the regression-reflection laser generator receives the reflected wafer detecting laser beam and converts the optical signal of the received wafer detecting laser beam into the corresponding second electrical signal; the wafer detecting laser beams emitted by the different regression-reflection laser generators have different frequencies; if it can be deduced from the second electrical signal that the regression-reflection laser generator can't receive the wafer detecting laser beam it emitted, then it can be judged that the wafer is clamped by the clamping jaw.

9. A wafer detection method realized with the wafer detection devices according to claim 5, which is used for detecting whether the wafer is clamped by the clamping jaw inside the CMP cleaning and drying device and whether the wafer is parallel to the bottom of the clamping jaw, and including following steps:

step S1, the wafer detecting unit emits a wafer detecting laser beam to the work plane; the wafer detecting unit receives the emitted wafer detecting laser beam, coverts the optical signal of the received wafer detecting laser beam into the second electrical signal or generates the distance value on basis of the received wafer detecting laser beam;

step S2, the detection processing unit coverts the second electrical signal into a second digital signal corresponding to which, if a value of the second digital signal is 0, the detection processing unit will judge that the wafer is clamped by the clamping jaw and enter step S3; or the detection processing unit compares the distance value with the distance threshold value saved in the detection processing unit, if the distance value is below the distance threshold value, the detection processing unit will judge that the wafer is clamped by the clamping jaw and enter the step S3; otherwise, the detection processing unit will judge that no wafer is clamped by the clamping jaw;

the step S3, the wafer parallel measuring unit emits the parallel measuring laser beam having different frequencies and parallel to the bottom of the clamping jaw; a distance between the parallel measuring laser beam and the bottom of the clamping jaw match with a distance between the work plane and the bottom of the clamping jaw; the wafer parallel measuring unit receives the parallel measuring laser beam and converts the optical signal of the received parallel measuring laser beam into the corresponding first electrical signal; enter step S4; and the step S4, the detection processing unit coverts the first electrical signal into a first digital signal corresponding to which, if a value of the first digital signal is below a first threshold value saved in the detection processing unit, the detection processing unit will judge that the wafer is not parallel to the bottom of the clamping jaw; otherwise, the detection processing unit will judge that the wafer is parallel to the bottom of the clamping jaw.

10. The wafer detection device according to claim 1, wherein the distance measuring laser sensor is electrically connected to the detection processing unit; the distance measuring laser sensor emits a wafer detecting laser beam to the work plane; the wafer detecting laser beam scatters in case of an obstacle; the distance measuring laser sensor receives the scattered wafer detecting laser beam and generates the distance value; if the distance value is below the distance threshold value preset in the detection processing unit, the detection processing unit will judge that the wafer is clamped by the clamping jaw.

11. A wafer detection method realized with the wafer detection devices according to claim 6, which is used for detecting whether the wafer is clamped by the clamping jaw inside the CMP cleaning and drying device and whether the wafer is parallel to the bottom of the clamping jaw, and including following steps:

step S1, the wafer detecting unit emits a wafer detecting laser beam to the work plane; the wafer detecting unit receives the emitted wafer detecting laser beam, coverts the optical signal of the received wafer detecting laser beam into the second electrical signal or generates the distance value on basis of the received wafer detecting laser beam;

step S2, the detection processing unit coverts the second electrical signal into a second digital signal corresponding to which, if a value of the second digital signal is 0, the detection processing unit will judge that the wafer is clamped by the clamping jaw and enter step S3; or the detection processing unit compares the distance value with the distance threshold value saved in the detection processing unit, if the distance value is below the distance threshold value, the detection processing unit will judge that the wafer is clamped by the clamping jaw and enter the step S3; otherwise, the detection processing unit will judge that no wafer is clamped by the clamping jaw;

the step S3, the wafer parallel measuring unit emits the parallel measuring laser beam having different frequencies and parallel to the bottom of the clamping jaw; a distance between the parallel measuring laser beam and the bottom of the clamping jaw match with a distance between the work plane and the bottom of the clamping jaw; the wafer parallel measuring unit receives the parallel measuring laser beam and converts the optical signal of the received parallel measuring laser beam into the corresponding first electrical signal; enter step S4; and the step S4, the detection processing unit coverts the first electrical signal into a first digital signal corresponding to which, if a value of the first digital signal is below a first threshold value saved in the detection processing unit, the detection processing unit will judge that the wafer is not parallel to the bottom of the clamping jaw; otherwise, the detection processing unit will judge that the wafer is parallel to the bottom of the clamping jaw.

12. The wafer detection device according to claim 1, wherein the wafer detecting unit includes: at least one transmittance laser generator and at least one transmittance laser receiver, and each transmittance laser receiver corresponds to one transmittance laser generator; the transmittance laser receiver is electrically connected to the detection processing unit; the transmittance laser generator emits a wafer detecting laser beam to the work plane, the wafer detecting laser beam is not blocked by the clamping jaw; the transmittance laser receiver receives the wafer detecting laser beam emitted by the corresponding transmittance laser generator and converts the optical signal of such received wafer detecting laser beam into the corresponding second electrical signal; if it can be deduced from the second electrical signal that the transmittance laser receiver can't receive the wafer detecting laser beam emitted by the corresponding transmittance laser generator, then it can be judged that the wafer is clamped by the clamping jaw.

13. A wafer detection method realized with the wafer detection devices according to claim 7, which is used for detecting whether the wafer is clamped by the clamping jaw inside the CMP cleaning and drying device and whether the wafer is parallel to the bottom of the clamping jaw, and including following steps:

step S1, the wafer detecting unit emits a wafer detecting laser beam to the work plane; the wafer detecting unit receives the emitted wafer detecting laser beam, coverts the optical signal of the received wafer detecting laser beam into the second electrical signal or generates the distance value on basis of the received wafer detecting laser beam;

step S2, the detection processing unit coverts the second electrical signal into a second digital signal corresponding to which, if a value of the second digital signal is 0, the detection processing unit will judge that the wafer is clamped by the clamping jaw and enter step S3; or the detection processing unit compares the distance value with the distance threshold value saved in the detection processing unit, if the distance value is below the distance threshold value, the detection processing unit will judge that the wafer is clamped by the clamping jaw and enter the step S3; otherwise, the detection processing unit will judge that no wafer is clamped by the clamping jaw;

the step S3, the wafer parallel measuring unit emits the parallel measuring laser beam having different frequencies and parallel to the bottom of the clamping jaw; a distance between the parallel measuring laser beam and the bottom of the clamping jaw match with a distance between the work plane and the bottom of the clamping jaw; the wafer parallel measuring unit receives the parallel measuring laser beam and converts the optical signal of the received parallel measuring laser beam into the corresponding first electrical signal; enter step S4; and the step S4, the detection processing unit coverts the first electrical signal into a first digital signal corresponding to which, if a value of the first digital signal is below a first threshold value saved in the detection processing unit, the detection processing unit will judge that the wafer is not parallel to the bottom of the clamping jaw; otherwise, the detection processing unit will judge that the wafer is parallel to the bottom of the clamping jaw.

14. The wafer detection device according to claim 1, wherein the wafer detecting unit includes: at least one transmittance laser generator, at least one transmittance laser receiver and at least one reflector, and each transmittance laser generator corresponds to one transmittance laser receiver and one reflector; the transmittance laser receiver is electrically connected to the detection processing unit; the transmittance laser generator emits a wafer detecting laser beam to the work plane, the corresponding reflector reflects the emitted wafer detecting laser beam, the corresponding transmittance laser receiver receives the reflected wafer detecting laser beam and coverts the optical signal of the received wafer detecting laser beam into the corresponding second electrical signal; both the emitted wafer detecting laser beams and the reflected wafer detecting laser beams are not blocked by the clamping jaw; if it can be deduced from the second electrical signal that the transmittance laser receiver can't receive the wafer detecting laser beam emitted by the corresponding transmittance laser generator, then it can be judged that the wafer is clamped by the clamping jaw.

15. A wafer detection method realized with the wafer detection devices according to claim 8, which is used for detecting whether the wafer is clamped by the clamping jaw inside the CMP cleaning and drying device and whether the wafer is parallel to the bottom of the clamping jaw, and including following steps:

step S1, the wafer detecting unit emits a wafer detecting laser beam to the work plane; the wafer detecting unit receives the emitted wafer detecting laser beam, coverts the optical signal of the received wafer detecting laser beam into the second electrical signal or generates the distance value on basis of the received wafer detecting laser beam;

step S2, the detection processing unit coverts the second electrical signal into a second digital signal corresponding to which, if a value of the second digital signal is 0, the detection processing unit will judge that the wafer is clamped by the clamping jaw and enter step S3; or the detection processing unit compares the distance value with the distance threshold value saved in the detection processing unit, if the distance value is below the distance threshold value, the detection processing unit will judge that the wafer is clamped by the clamping jaw and enter the step S3; otherwise, the detection processing unit will judge that no wafer is clamped by the clamping jaw;

the step S3, the wafer parallel measuring unit emits the parallel measuring laser beam having different frequencies and parallel to the bottom of the clamping jaw; a distance between the parallel measuring laser beam and the bottom of the clamping jaw match with a distance between the work plane and the bottom of the clamping jaw; the wafer parallel measuring unit receives the parallel measuring laser beam and converts the optical signal of the received parallel measuring laser beam into the corresponding first electrical signal; enter step S4; and the step S4, the detection processing unit coverts the first electrical signal into a first digital signal corresponding to which, if a value of the first digital signal is below a first threshold value saved in the detection processing unit, the detection processing unit will judge that the wafer is not parallel to the bottom of the clamping jaw; otherwise, the detection processing unit will judge that the wafer is parallel to the bottom of the clamping jaw.

16. A wafer detection method realized with the wafer detection devices according to claim 1, which is used for detecting whether the wafer is clamped by the clamping jaw inside the CMP cleaning and drying device and whether the wafer is parallel to the bottom of the clamping jaw, and including following steps:

step S1, the wafer detecting unit emits a wafer detecting laser beam to the work plane; the wafer detecting unit receives the emitted wafer detecting laser beam, coverts the optical signal of the received wafer detecting laser beam into the second electrical signal or generates the distance value on basis of the received wafer detecting laser beam;

step S2, the detection processing unit coverts the second electrical signal into a second digital signal corresponding to which, if a value of the second digital signal is 0, the detection processing unit will judge that the wafer is clamped by the clamping jaw and enter step S3; or the detection processing unit compares the distance value with the distance threshold value saved in the detection processing unit, if the distance value is below the distance threshold value, the detection processing unit will judge that the wafer is clamped by the clamping jaw and enter S3; otherwise, the detection processing unit will judge that no wafer is clamped by the clamping jaw;

the step S3, the wafer parallel measuring unit emits the parallel measuring laser beam having different frequencies and parallel to the bottom of the clamping jaw; a distance between the parallel measuring laser beam and the bottom of the clamping jaw match with a distance between the work plane and the bottom of the clamping jaw; the wafer parallel measuring unit receives the parallel measuring laser beam and converts the optical signal of the received parallel measuring laser beam into the corresponding first electrical signal; enter step S4; and the step S4, the detection processing unit coverts the first electrical signal into a first digital signal corresponding to which, if a value of the first digital signal is below a first threshold value saved in the detection processing unit, the detection processing unit will judge that the wafer is not parallel to the bottom of the clamping jaw; otherwise, the detection processing unit will judge that the wafer is parallel to the bottom of the clamping jaw.

* * * * *